United States Patent [19]
Goretta et al.

[11] Patent Number: 5,929,001
[45] Date of Patent: Jul. 27, 1999

[54] ENGINEERED FLUX-PINNING CENTERS IN BSCCO TBCCO AND YBCO SUPERCONDUCTORS

[75] Inventors: Kenneth C. Goretta, Downers Grove; Michael T. Lanagan, Woodridge; Dean J. Miller, Darien, all of Ill.; Suvankar Sengupta, Upper Arlington, Ohio; John C. Parker, Naperville, Ill.; Jieguang Hu, Woodridge, Ill.; Uthamalingam Balachandran; Richard W. Siegel, both of Hinsdale, Ill.; Donglu Shi, Oak Park, Ill.

[73] Assignee: University of Chicago, Chicago, Ill.

[21] Appl. No.: 08/541,060

[22] Filed: Oct. 11, 1995

[51] Int. Cl.$^6$ .......................... H01B 12/00; C04B 35/50; C04B 35/505; C04B 35/63

[52] U.S. Cl. .......................... 505/490; 505/491; 505/492; 505/500; 505/739; 75/252; 75/751; 252/521; 423/28

[58] Field of Search .......................... 505/425, 430, 505/440, 490, 491, 492, 500, 501, 739, 785; 75/252, 751, 768; 423/21.1, 28; 252/521

[56] References Cited

U.S. PATENT DOCUMENTS

| | | | |
|---|---|---|---|
| 4,975,415 | 12/1990 | Gusman et al. | 505/425 |
| 5,037,801 | 8/1991 | Kloucek | 505/1 |
| 5,152,973 | 10/1992 | Spencer | 423/419 P |
| 5,395,821 | 3/1995 | Kroeger et al. | 505/431 |
| 5,417,956 | 5/1995 | Moser | 423/592 |

FOREIGN PATENT DOCUMENTS

9004856  5/1990  WIPO.

OTHER PUBLICATIONS

Sakqu et al "Superconductivity of $YBa_2Cu_3O_{7-y}$ by Addition of Reactive Fine Powders" Jap. Jour. Appl. Physics, vol. 30, No. 2, Feb. 1991 pp. 246–250.

Takauo et al "Composite $YBa_2Cu_3O_{7-x}$ Superconductor Prepared by Spray Drying Method" Advances in Supercon. V, Nov. 1992 pp. 669–672.

Composite $YBa_2CU_3O_{7-x}$, Superconductor Prepared by Spray Drying Method, Y. Takao, et al., Proceedings of the 5th International Symposium on Superconductivity (ISS '92), Nov. 16–19, 1992, p.669.

Superconductivity of $YBa_2Cu_3O_{7-x}$, by Addition of Reactive Fine Powders, T. Sakai, J Jap vol. 30, No. 2, p. 246, Feb. 1991.

Enhanced critical currents by $CeO_2$ additions in directionally solidified $YBa_2Cu_3O_7$, S. Piñol, et al., Appl. Phys. Lett. 65(11), Sep. 12, 1994.

TEM Study of Flux Pinning Defects in $YBa_2Cu_3O_x$ Produced by 580–MeV Sn ion Irradiation, R. Wheeler, et al., Mat. Res. Soc. Symp. Proc., 235, 683 (1992).

Enhancements of The Critical Currents of YBaCuO Single Crystals by Neutron and Proton Irradiation, B.M. Vlcek, et al., IEEE Transactions on Applied Superconductivity, 3(1), 1491 (1993).

(List continued on next page.)

*Primary Examiner*—Paul Lieberman
*Assistant Examiner*—Mark Kopec
*Attorney, Agent, or Firm*—Foley & Lardner; Michael D. Rechtin

[57] ABSTRACT

A method of preparing a high temperature superconductor. A method of preparing a superconductor includes providing a powdered high temperature superconductor and a nanophase material. These components are combined to form a solid compacted mass with the material disposed in the polycrystalline high temperature superconductor. This combined mixture is rapidly heated, forming a dispersion of nanophase size particles without a eutectic reaction. These nanophase particles can have a flat plate or columnar type morphology.

15 Claims, 4 Drawing Sheets

OTHER PUBLICATIONS

Structural and Flux Pinning Properties of Irradiated Defects in $YBa_2Cu_3O_{7-x}$, M.A. Kirk, Cryogenics, 33, 235 (1993).

Superconducting Current Density Enhancement by Heavy Ion Irradiation of Bi–2223 Silver–Clad Tapes, L. Civale, et al., Physica C, 208, 137 (1993).

Synthesis, Characterization, and Properties of Nanophase Ceramics, R.W. Siegel and J.A. Eastman, Mater. Res. Symp. Proc., 132, 3 (1989).

Nanometer–size Fiber Composite Synthesis by Laser–Induced Reactions, G.M. Chow, et al., J. Appl. Phys., 66, 3304 (1989).

ENGINEERED FLUX-PINNING CENTERS IN BSCCO TBCCO AND YBCO SUPERCONDUCTORS

The United States Government has rights in this invention pursuant to Contract No. W-31-109-ENG-38 between the U.S. Department of Energy and The University of Chicago, representing Argonne National Laboratory.

The present invention is concerned generally with an article of manufacture and a method of manufacturing high temperature superconductors having improved superconducting properties. More particularly, the invention is concerned with an article and method of manufacture of high temperature superconductors having improved intragrain critical current density, or $J_c$, by use of nanophase sized particles to introduce flux pinning centers. Such nanophase particles can have a columnar, acicular, spherical or plate type of morphologies to further improve flux pinning.

Development of useful high temperature superconductors has been difficult since the discovery of such superconductors. In order to be commercially useful, it is important to improve the intragrain transport critical current density of these superconductor. Recent experiments have determined that introduction of certain types of defects, such as dislocations, twin boundaries and stacking faults, can improve flux pinning which enhances the critical current density, $J_c$. Although these defects can be quite effective in pinning flux lines, these defects can be difficult to introduce in a controlled manner, and reproducibility in a commercial manufacturing operation could be difficult. Moreover, such defects tend to be very unstable and change of the defect states could lead to loss of the desired enhancement of properties. Other approaches have also been used to introduce flux pinning sites, such as by introduction of substantial radiation damage centers, but such techniques are expensive, time consuming and the damage centers are not usually stable when exposed to elevated temperatures.

OBJECTS OF THE INVENTION

It is therefore an object of the invention to provide an improved form of high temperature superconductor.

It is yet another object of the invention to provide an improved method and article of manufacture prepared by rapidly heating to a temperature above an initial peritectic melt completion temperature a cold pressed mixture of high temperature superconductor and nanophase size oxide of different chemical constituent than the base superconductor.

It is also another object of this invention to provide a novel method and article of manufacture of a high temperature superconductor having nanophase size particles with a columnar or plate morphology.

It is another object of the invention to provide a novel article and method of manufacture of high temperature superconductor with improved intragrain transport properties arising from nanophase size particles acting as flux pinning centers.

It is also an object of the invention to provide a novel article and method of manufacture of a high temperature superconductor with nanophase size particle additions of metal oxides, such as $Y_2O_3$, $TiO_2$, $MgO$, $Al_2O_3$, $La_2O_3$ and $SnO_2$, before the superconductor undergoes heat treatment.

It is still another object of the invention to provide a novel article and method of manufacture of a high temperature superconductor having nanophase size particles disposed throughout the grains of the superconductor to establish a large number of flux pinning sites.

It is yet a further object of the invention to provide an improved article and method of manufacture of a high temperature superconductor with nanophase size particles of about 10–100 nm diameter, spaced about 10–100 nm apart and occupying about 10–30 volume percent relative to the entire mass of the superconductor.

These objects and other advantages and features of the invention will be readily apparent from the following description of the preferred embodiments, taken in conjunction with the accompanying drawings described herein below.

DETAILED DESCRIPTION OF PREFERRED EMBODIMENTS

The critical current density, $J_c$, in a high temperature superconductor (hereinafter, "HTSC") can be improved by controlled addition of ultra-fine grained phases, such as nanophase size particles. The nanophase materials can be either inert or reactive. Normally, application of a magnetic field causes drastic diminution of $J_c$ which is usually quite large within each HTSC grain. In order to overcome this problem created by the magnetic field, small nanophase size particles can be introduced into the HTSC to enhance flux pinning to thereby enhance $J_c$ within grains. Preferably, the nanophase materials are compounds such as $SnO_2$, $Al_2O_3$, $TiO_2$, $Y_2O_3$ and $MgO$. As will be described hereinafter, substantial improvement of flux pinning can be achieved by addition of such nanophase size particles for all the major groups of high temperature superconductors, as exemplified by Y-123, Bi-2212 and Tl-1223.

In a preferred form of the invention nanophase size $Al_2O_3$ powders were synthesized from Al metal by a conventional gas-phase condensation process, and these nanophase powders were incorporated into Bi-2212 and Tl-1223 specimens (see Examples 1–3). The particle size of the $Al_2O_3$ was about 10–100 nm and the specific surface areas was ≈57 $m^2/g$. The superconductor and nanophase size powders were mixed in 4:1 molar ratios. The powders were vibratory milled for 1 h in polyethylene jars containing a dispersant, isopropyl alcohol, and $Y_2O_3$-stabilized $ZrO_2$ grinding media. The resultant slurries were dried over a hot plate while being stirred continuously. The powders were cold pressed into 2 g pellets, 12.7 mm in diameter, were heated to 350° C. in flowing $O_2$ and then held for 3 h to remove volatile species.

A rapid melt processing technique was carried out as follows: the Bi-2212 specimens were placed on Ag foil; the Tl-1223 specimens were placed into the Pt crucible/Ag cap assembly that was used for synthesis. Y-123 also can be processed in the same manner as Tl-1223. Each pellet was inserted from a cool region of the furnace (<600° C.) directly into the hottest zone. For example, in the case of Bi-2212 the temperature is about 870–900° C. in air and 880–910° C. in oxygen; for Tl-1223, 880–910° C. in air and 890–930° C. and for Y-123, 1000–1 150° C. generally.

In the preferred method, the Bi-2212 specimens were heated in air to a maximum temperature of 885° C., and then cooled from the melt at 10° C./h. The Tl-1223 specimens were heated in $O_2$ to a maximum temperature of 915° C., and then cooled at 10° C./h. The above described heating process is directed to minimizing a eutectic reaction. This is therefore accomplished generally by heating rapidly as possible to a temperature, defined by conventional differential thermal analysis (DTA) plots as a temperature above the initial peritectic melt temperature. This rapid heating is intended therefore to suppress the eutectic phase reaction. This enables forming a high density of flux pinning sites of nanophase size oxide particles.

In order to facilitate $J_c$ characterization, processed material was cooled in liquid $N_2$ and then quickly crushed with an agate mortar and pestle. This grinding step ensured that the resultant average particle size (<20 $\mu$m) was smaller than the average grain size of the melt-processed pellets. Thus, to a good approximation, the effects of grain boundaries could be neglected in magnetization measurements. No post-sintering annealings were performed.

In another experiment, Y-123 pellets were placed on MgO single crystals that were in shallow $Al_2O_3$ crucibles. The pellets were either heated rapidly to a maximum temperature or inserted directly into hot furnaces. The processing was performed in air; the maximum temperature was 1045° C. and the cooling rate from the melt was 1° C./h. When the pellets reached room temperature, they were removed from their crucibles. The pellets were crushed to powders, and the powders were annealed in $O_2$ at 425° C. for 4 h to ensure optimal $T_c$ values. Magnetization-hysteresis data were then obtained with a vibrating specimen magnetometer (See FIG. 4).

Powders and polished cross sections of heat-treated pellets were examined by X-ray diffraction and scanning electron microscopy (SEM). Energy dispersive spectroscopy was performed during SEM to facilitate phase analysis. Transmission electron microscopy (TEM) was performed on representative samples of the as-ground powders.

A low-field SQUID magnetometer was used to measure the critical temperature $T_c$. Powdered specimens were cooled in zero field to <40K, a field of 0.5 Oe was then applied, and magnetization was monitored on heating. To determine differences in flux pinning, magnetic-hysteresis measurements were performed on the powders. Either a commercial high-field SQUID or vibrating-specimen magnetometer (VSM) was used. For the SQUID measurements, powdered specimens were cooled in zero field and then a magnetic field was applied. Periods of thirty seconds were allowed between application of the magnetic field and each magnetization measurement. For the VSM measurements, the field was ramped at 80 G/s.

In a preferred embodiment the nanophase size particles are about 10–100 nm in diameter. Two distinct approaches can be used when adding the nanophase size oxides: (1) addition of complex oxides, such as $Y_2BaCuO_5$ into Y-123, or $(Sr,Ca)_2CuO_3$ into Bi-2212 or other oxides that will not react with the superconductor; or (2) addition of simple oxides that will react with superconductor, such as $TiO_2$ added to Y-123 to form $BaTiO_3$, or $Al_2O_3$ added to Tl-1223 to form $BaAlO_4$. Although the first approach has the advantage of chemical compatibility, it can have some disadvantages. For example, complex oxides can be costly to produce on a nanophase size level. In addition, because their constituent actions are present in the melt during processing, the complex oxides will be susceptible to growth, and, for superconductors such as Bi-2212, a given oxide such as $(Sr,Ca)_2CuO_3$ or $(Sr,Ca)_{14}Cu_{24}O_{41}$ may not be stable over the entire range of processing conditions. In contrast, the second approach is less expensive, and the resultant oxides should be less susceptible to coarsening in the melt.

Figure 1:
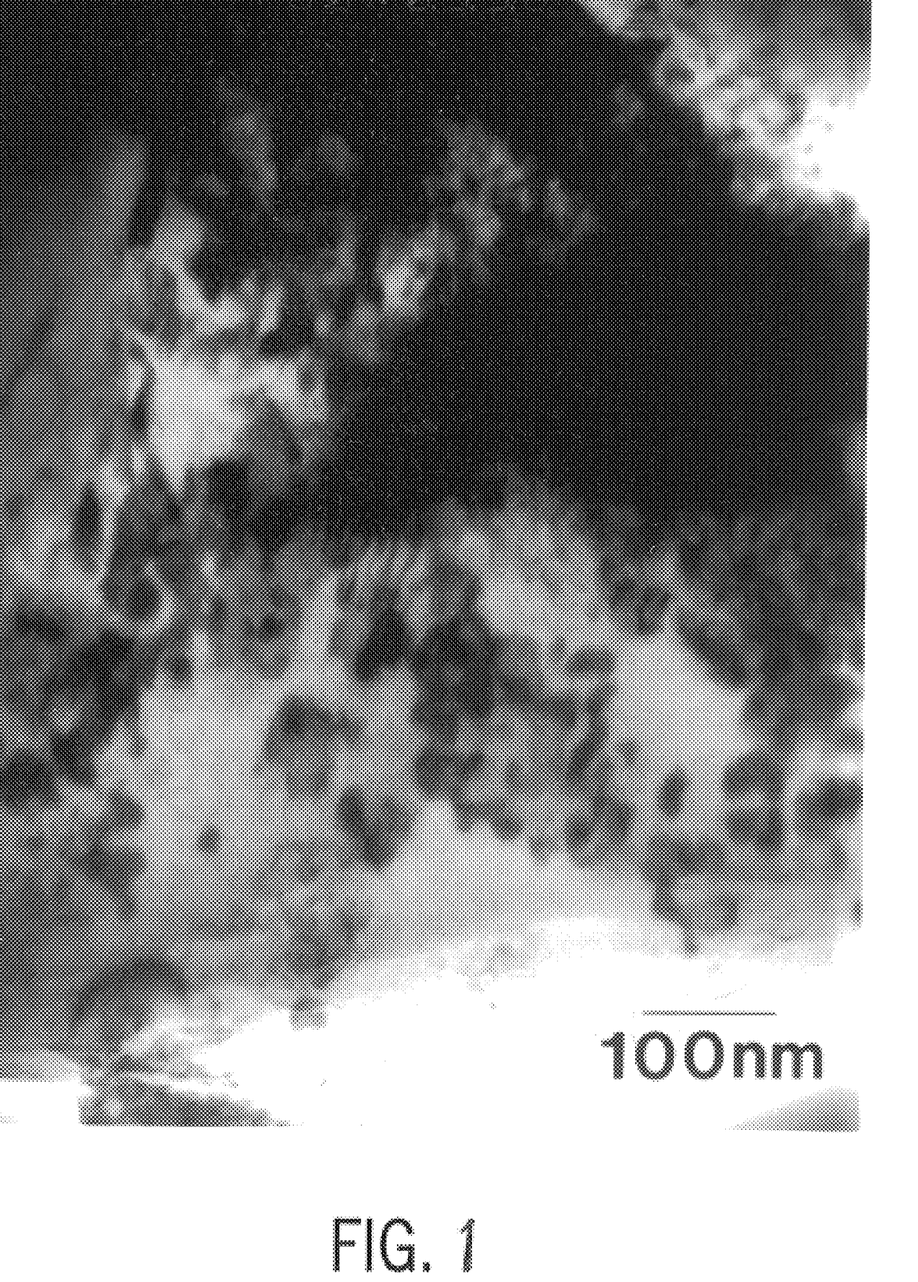
FIG. 1 illustrates a bright field TEM micrograph of Tl-1223 plus added nanophase $Al_2O_3$ particles showing the presence of ultra-fine precipitates within the grains.

X-ray diffraction (XRD) and SEM examination of specimens with micron-scale $Al_2O_3$ additions revealed that the Bi-2212 reacted with the $Al_2O_3$ to form a phase with the approximate composition $BiSr_{1.5}Ca_{0.5}Al_2O_x$; the Tl-1223 reacted to form $BaAl_2O_4$. TEM observation of a specimen with nanophase size oxide additions revealed the presence of large regions of Tl-1223 phase with high concentrations of precipitates <50 nm in size (FIG. 1). The precipitates were $BaAl_2O_4$.

Figure 2:
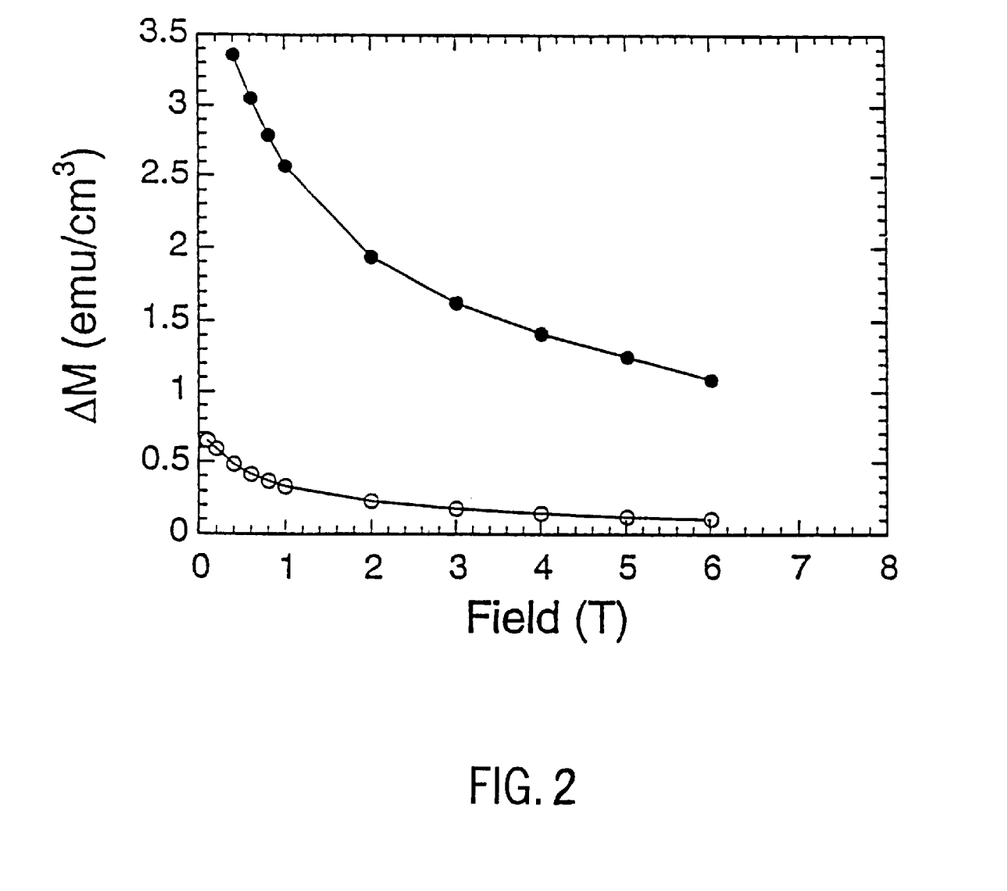
FIG. 2 illustrates SQUID magnetization data at 5K for Bi-2212 with nanophase size $Al_2O_3$ particles (filled circles) and without such particles (open circles)

$Al_2O_3$ additions to Bi-2212 caused a slight depression in $T_c$ from the undoped value of ≈85K to ≈80K, although the transition remained sharp. For the Tl-1223, the $T_c$ (≈118K) was virtually unaffected by the $Al_2O_3$ additions. Magnetization-hysteresis data obtained by SQUID for Bi-2212 with and without $Al_2O_3$ additions are shown in FIG. 2. At 5K, the $Al_2O_3$ additions resulted in an expansion in hysteresis width by a factor of ≈5.

Figure 3:
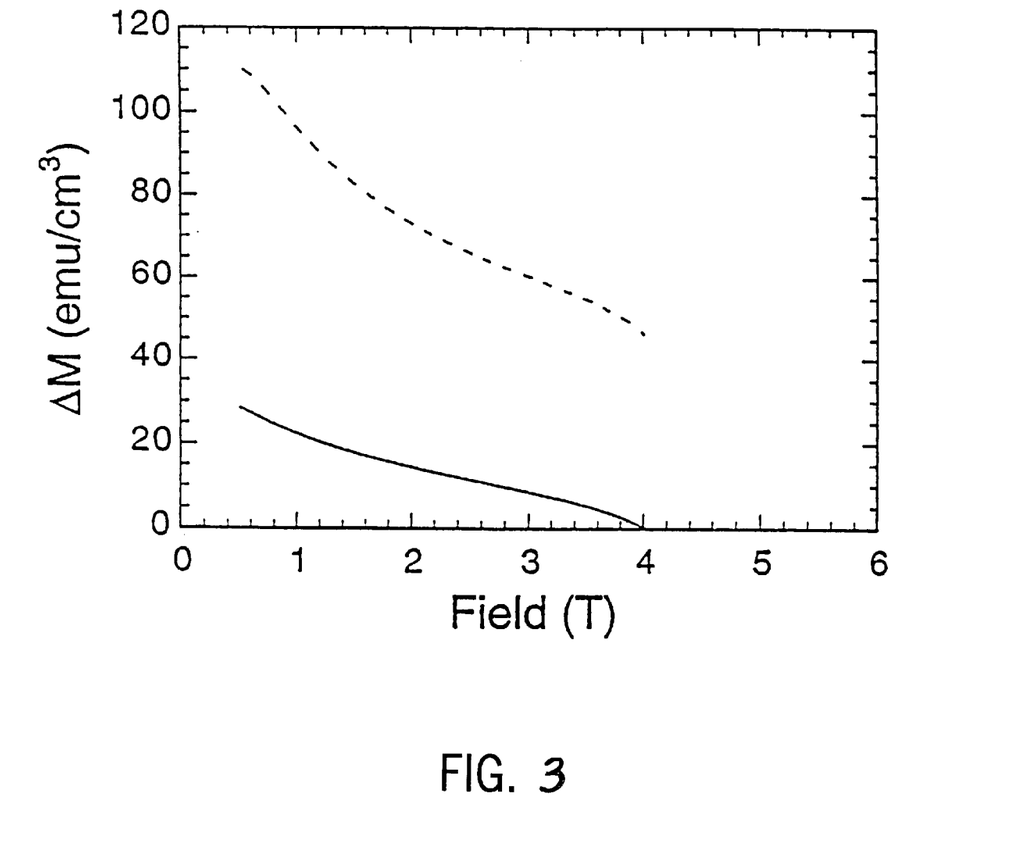
FIG. 3 illustrates vibrating specimen magnetometer (VSM) magnetization data for Tl-1223 in FIG. 4A at 4.2K; specimens with nanophase size $Al_2O_3$ additions are shown by a bold line and those without additions by a thin solid line.

Data obtained by VSM for Tl-1223 with and without nanophase size particle $Al_2O_3$ additions are shown in FIG. 3. These additions expanded the hysteresis loop substantially at 4.2K (note: only the positive part of the loop is shown).

Figure 4:
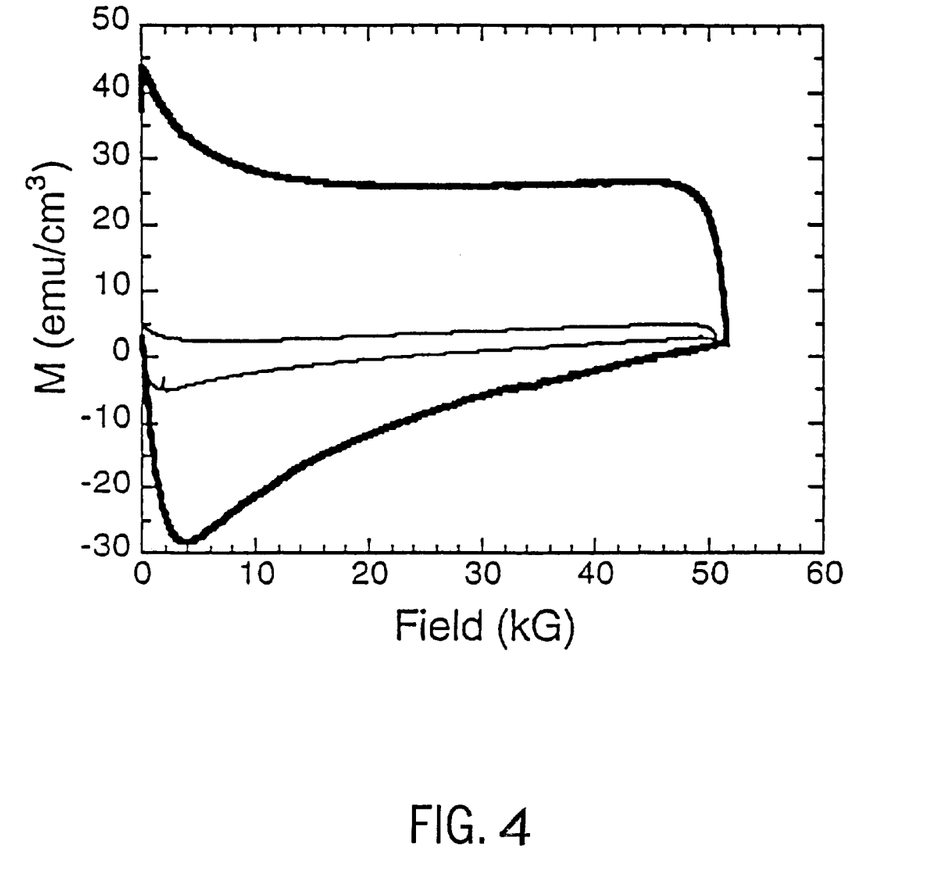
FIG. 4 illustrates VSM data for hysteresis effects in melt processed Y-123 with the thin line being pure Y-123 and the bold line for Y-123 with nanophase size $TiO_2$ addition.

Magnetization-hysteresis data for Y-123+$TiO_2$ and pure Y-123 are show in FIG. 4. At 4.2K, the oxide additions substantially increased hysteresis widths. Microscopic studies indicated that the $TiO_2$ reacted with the Y-123 to form nanoscale $BaTiO_3$.

In another form of the invention the high temperature superconductors contain complex oxide materials preferably in the form of nonspherical, nanophase particles or aggregates with aspect ratios greater than unity. Most preferably the shape is thin plates or rods with aspect ratios of at least 5. In this particular embodiment, flux pinning centers in the shape of rods or thin plates with thickness of ≈5 nm, lengths of ≈50nm and widths of ≈5 nm can be introduced by mixing high melting point oxides, such as MgO, $ZrO_2$, $TiO_2$, $SrTiO_3$ and $LaAlO_3$ with the oxide superconductors. Such nanophase particles or aggregates embodied in the superconductor matrix can pin the flux lines effectively and enhance the intragrain transport critical current density in high applied magnetic fields.

In another embodiment, nanophase size spherical particles in the size range of about 5–10 nm can be used as flux pinning centers for low field applications. The improved flux pinning results in bulk superconductors with increased levitation force, and also provides stability to the permanent magnet rotating over the superconductor (such as in bearings and flywheel energy storage applications).

The following nonlimiting examples illustrate various methods of preparation of base superconductors and addition of nanophase size particles to the superconductors.

EXAMPLE 1

Bi-2212 of composition $Bi_2Sr_{1.7}CaCu_2O_x$ and $Bi_{2.2}Sr_{1.8}CaCu_2O_x$ were synthesized by reaction of reagent-grade $Bi_2O_3$, $SrCO_3$, $CaCO_3$, and CuO powders. The powders were ball milled for ≈24 h, dried, ground lightly with an agate mortar and pestle, sieved, and heated in air. The heat treatment consisted of slow initial heating to ≈800° C., followed by heating at 3° C./min to 885° C., holding for 0.2 h, cooling at 3° C./min to 842° C. and holding for ≈72 h, then cooling at 3° C./min to room temperature. The resulting powder was ground in a tungsten carbide rotary mill. No phase other than Bi-2212 was observed by X-ray diffraction (XRD) or differential thermal analysis (DTA).

EXAMPLE 2

Tl-1223 of composition Tl-$Ba_2Ca_2Cu_3O_x$ was made by reacting $Tl_2O_3$ with a precursor oxide $Ba2Ca_2Cu_3O_x$. It was ≈90% pure, with $BaCuO_2$ as the principal detected impurity phase.

Nonophase $Al_2O_3$ powders were synthesized by a conventional gas-phase condensation process. Gas convection was used to condense nanocrystallites from a vapor created by evaporating Al. Particle size was 10–100 nm and specific surface areas were ≈57 $m^2$/g.

The superconductor and nanophase powders were mixed in molar ratios of 4 to 1. The mixture was placed in polyethylene jars containing isopropyl alcohol and $Y_2O_3$stabilized $ZrO_2$ grinding media, and vibratory milled for 1 h. The resultant slurry was dried over a hot plate while being stirred. The powder was then pressed into 1 g pellets 12.7 mm in diameter.

To remove volatiles, all pellets were heated to 350° C. in fllowing $O_2$ and held for 3 h. For melt-processing, the Tl-1223 specimens were placed into a Pt crucible that was sealed with a tightly fitting Ag cap. The pellets were either heated rapidly to a maximum temperature or inserted directly into hot furnaces. The processing was performed in $O_2$; the maximum temperature was 915° C. and the cooling rate from the melt was 10° C./h.

When the pellets reached room temperature, they were removed form their crucibles. All pellets were immersed in liquid $N_2$ and crushed with an agate mortar and pestle. This grinding step was performed because the resultant particle sizes were smaller than the average grain size of the melt-processed pellets. Thus, to a good approximation, the effects of grain boundaries were negligible in the magnetization measurements.

To determine differences in flux pinning, magnetic-hystereses of the powders were measured with a commercial vibrating-specimen magnetometer, which contained a superconducting magnet in a gas-flow-type cryostat. The field was ramped at a rate of 80 G/s. For T>70K, a Pt resistance thermometer was used for temperature control; for T<70K, a carbon glass thermometer was used.

EXAMPLE 3

Y-123 powder of composition $YBa_2Ca_2Cu_3O_x$ was synthesized form $Y_2O_3$, $BaCO_3$, and CuO powder. X-ray diffraction and differential thermal analysis showed it to be phase-pure.

Nanophase $TiO_2$ powder was synthesized by a gas-phase condensation process. Gas convection was used to condense nanocrystallites from a vapor created by evaporating Ti metal. Particle size was 10–100 nm and specific surface area was ≈57 $M^2$/g.

The superconductor and nanophase powders were mixed in molar ratios of 4 to 1. The powders were placed in polyethylene jars containing isopropyl alcohol and $Y_2O_3$-stabilized $ZrO_2$ grinding media, and vibratory milled for 1 h.

The resultant slurries were dried over a hot plate while being stirred. The powders were then pressed into 1 g pellets 12.7 mm in diameter.

To remove volatiles, all pellets were heated to 350° C. in flowing $O_2$ and held for 3 h. For melt-processing, the Y-123 pellets were placed on MgO single crystals that were in shallow $Al_2O_3$ crucibles. The pellets were either heated rapidly to a maximum temperature or inserted directly into hot furnaces.

The Y-123 processing was performed in air; the maximum temperature was 1045° C. and the cooling rate from the melt was 1° C./h.

When the pellets reached room temperature, they were removed from their crucibles. All pellets were immersed in liquid $N_2$ and crushed with an agate mortar and pestle. This grinding step was performed because the resultant particle sizes were smaller than the average grain size of the melt-processed pellets. Thus, to a good approximation, the effects of grain boundaries were negligible in the magnetization measurements. Scanning electron microscopy (SEM) revealed that the resultant grain-size distributions of the pure superconductors and those doped with nanophase oxides, 1–20 µm with an average of 10 µm, were nearly identical. The Y-123 powders were annealed in $O_2$ at 425° C. for 4 h to ensure optimal $T_c$ values.

To determine differences in flux pinning, magnetic-hystereses of the powders were measured with a commercial vibrating-specimen magnetometer, which contained a superconducting magnet in a gas-flow-type cryostat. The field was ramped at a rate of 80 G/s. For T>70K, a Pt resistance thermometer was used for temperature control; for T<70K, a carbon glass thermometer was used.

The above embodiments illustrate various forms of the invention but variations and modifications of these embodiments are encompassed within the scope of the following claims.

What is claimed is:

1. A method of preparing a high temperature superconducting material, comprising the steps of:
   (a) providing a powered high temperature copper oxide based superconductor;
   (b) providing nanophase size metal oxide particles of 10–100 mn diameter; and
   (c) combining said nanophase size particles with said powdered high temperature superconductor to form a dispersion of said particles in said powdered high temperature superconductor; and
   (d) forming a compacted, solid mass of said high temperature superconductor and said particles with said nanophase particles occupying about 10–30 volume percent of said solid mass.

2. The method as defined in claim 1 wherein said nanophase size particles are spaced about 10–100 nm apart.

3. The method as defined in claim 1 wherein said nanophase size particles are selected from the group consisting of titania and alumina particles.

4. The method as defined in claim 1 wherein said high temperature superconductor is selected from the group consisting of YBCO, BSCCO and TBCCO each with the nanophase size particles.

5. The method as defined in claim 4 wherein said nanophase size are selected from the group consisting of titania and alumina.

6. The method as defined in claim 1 wherein said nanophase size particles comprise at least one of a flat plate type particle and a columnar type particle.

7. A method of preparing a high temperature superconductor, comprising the steps of:

(a) providing a powdered form of high temperature copper oxide based superconductor;

(b) providing a nanophase size metal oxide powder having particle diameters of 10–100 nm;

(c) combining said powdered superconductor and said nanophase powder; and (d) thermally treating said combined mixture of superconductor and nanophase size powder to form a solid mass having said nanophase size powder disposed as nanophase particles in said superconductor with said nanophase powder occupying about 10–30 volume percent of said solid mass.

8. The method as defined in claim 7 wherein said step (d) comprises at least one of firing or sintering said combined mixture.

9. The method as defined in claim 7 wherein said nanophase size particles are spaced apart about 10–500 nm.

10. A method of preparing a high temperature superconducting material, comprising the steps of:

(a) providing a powdered high temperature copper oxide based superconductor;

(b) providing nanophase size metal oxide particles of about 10–100 nm diameter;

(c) combining said nanophase size particles with said powdered high temperature superconductor to form a dispersion of said particles in said powdered high temperature superconductor; and (d) heating said combined mixture of nanophase size particles and high temperature superconductor by rapidly raising temperature of said combined mixture above an initial melt temperature and suppressing a eutectic reaction, and then cooling said combined mixture, thereby forming a dispersion of said nanophase size particles in said high temperature superconductor with said nanophase particles occupying about 10–30 volume percent of said mixture.

11. The method as defined in claim 10 wherein said high temperature superconductor is selected from the group consisting of YBCO, TBCCO and BSCCO.

12. The method as defined in claim 10 wherein said nanophase size particles have a columnar shape.

13. The method as defined in claim 12 wherein said columnar shaped particles have an aspect ratio of at least about 5:1.

14. The method as defined in claim 10 wherein said nanophase size particles have a plate shape.

15. The method as defined in claim 14 wherein said plate shaped particles have an aspect ratio of at least about 5:1.

* * * * *

UNITED STATES PATENT AND TRADEMARK OFFICE
CERTIFICATE OF CORRECTION

PATENT NO. : 5,929,001

DATED : July 27, 1999

INVENTOR(S) : Goretta et al.

It is certified that error appears in the above-identified patent and that said Letters Patent is hereby corrected as shown below:

In col. 5, line 13, change "Ba2" to -- $Ba_2$ --.

In col. 5, line 24, change "$O_3$stabilized" to -- $O_3$-stabilized --.

In col. 5, line 37, change "form" to -- from --.

In col. 5, line 56, change "form" to -- from --.

In col. 6, line 23, change "of 10 µm" to -- of≈10 µm --.

In col. 6, line 44, change "100 mn" to -- 100 nm --.

Signed and Sealed this

Thirteenth Day of June, 2000

Attest:

Q. TODD DICKINSON

*Attesting Officer*

*Director of Patents and Trademarks*